United States Patent [19]
Goodall

[11] Patent Number: 5,059,458
[45] Date of Patent: Oct. 22, 1991

[54] GLAZING UNITS
[75] Inventor: David R. Goodall, St. Helens, England
[73] Assignee: Pilkington PLC, St. Helens, England
[21] Appl. No.: 565,198
[22] Filed: Aug. 9, 1990

Related U.S. Application Data

[63] Continuation of Ser. No. 229,654, Aug. 8, 1988, abandoned.

[30] Foreign Application Priority Data

Aug. 14, 1987 [GB] United Kingdom ................ 8719258

[51] Int. Cl.⁵ .......................... E06B 1/04; E04C 2/54
[52] U.S. Cl. ...................................... 428/34; 428/212; 428/215; 428/336; 428/410; 428/432; 428/434; 428/469; 428/701; 428/702; 428/913; 52/788; 52/790
[58] Field of Search ................ 428/34, 409, 432, 434, 428/212, 213, 215, 334, 336, 410, 469, 701, 702, 913; 52/171, 172, 788, 790; 156/107, 109

[56] References Cited

U.S. PATENT DOCUMENTS

| 3,609,293 | 9/1971 | Stewart | 219/200 |
|---|---|---|---|
| 3,629,554 | 12/1971 | Stewart | 219/522 |
| 3,710,074 | 1/1973 | Stewart | 219/203 |
| 3,889,026 | 6/1975 | Groth | 428/34 |
| 4,069,630 | 1/1978 | Chess et al. | 428/34 |
| 4,166,876 | 9/1979 | Chiba et al. | 428/215 |
| 4,320,169 | 3/1982 | Yatabe et al. | 428/212 |
| 4,513,543 | 4/1985 | Lawrenson et al. | 428/209 |
| 4,563,843 | 1/1986 | Grether et al. | 52/172 |
| 4,565,719 | 1/1986 | Phillips et al. | 428/216 |
| 4,610,115 | 9/1986 | Thompson, Jr. | 52/171 |

FOREIGN PATENT DOCUMENTS

| 0035906 | 9/1981 | European Pat. Off. . |
| 0117885 | 9/1984 | European Pat. Off. . |
| 0233003 | 8/1987 | European Pat. Off. . |
| 1152691 | 5/1969 | United Kingdom . |
| 1307642 | 2/1973 | United Kingdom . |
| 1336825 | 11/1973 | United Kingdom . |
| 1364712 | 8/1974 | United Kingdom . |
| 1391726 | 4/1975 | United Kingdom . |
| 2068442 | 8/1981 | United Kingdom . |
| 2097288 | 11/1982 | United Kingdom . |
| 2129831 | 5/1984 | United Kingdom . |
| 2174412 | 11/1986 | United Kingdom . |

Primary Examiner—Ellis P. Robinson
Assistant Examiner—Donald J. Loney
Attorney, Agent, or Firm—Burns, Doane, Swecker & Mathis

[57] ABSTRACT

A double glazing unit comprising an outer pane of body colored heat absorbing glass and an inner pane of annealed glass with a coating including a silver layer having a thickness in the range 15 nm to 40 nm on its face turned towards the outer pane.

12 Claims, 1 Drawing Sheet

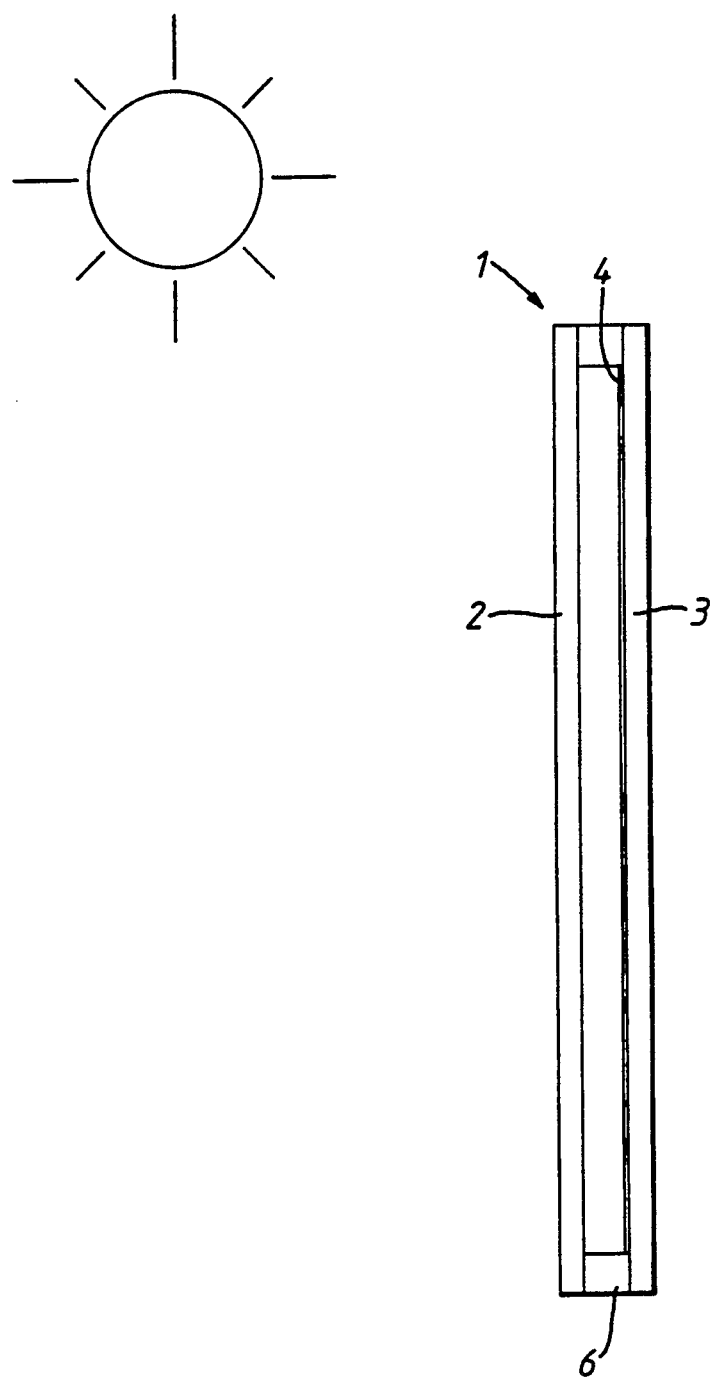

GLAZING UNITS

This application is a continuation of application Ser. No. 07/229,654, filed Aug. 8, 1988 now abandoned.

BACKGROUND OF THE INVENTION

1. Field of the Invention

The invention relates to solar control coatings on glass and, in particular, to double glazing units incorporating highly reflecting solar control coatings of silver metal.

The term 'solar control' is used to refer to coatings used on glass to reduce the amount of solar heat which enters buildings through the windows in order to avoid overheating within the building and/or reduce the load on air-conditioning plant cooling the building. A wide range of solar control coatings of different composition and thickness, to give a range of colours and performance, is commercially available.

2. Description of the Prior Art

Typically, solar control coatings function by reflecting a proportion of solar heat incident upon them. They also cause the coated glass to absorb an increased proportion of the incident solar heat, and much of that absorbed solar heat is re-radiated towards the outside. Even glasses with coatings which are generally considered as highly reflecting, for example REFLECTAFLOAT (trade mark) glass from Pilkington Glass Limited, depend heavily for their performance on the absorption of solar heat. As a result of such solar heat absorption, the coated glasses become hot in use and it is frequently necessary to toughen the coated glass in order to avoid breakage through overheating. It would be desirable to have a coated solar control glass which could be widely used without the need for toughening. This is particularly important for coated glasses which are not toughenable i.e. coated glasses which lose their useful properties on toughening. To produce such glasses in coated form, it is necessary to toughen the glass and then coat it. This is an expensive procedure, since in practice it involves coating relatively small pieces of toughened glass, rather than large stock sizes which can be cut up for use later.

Moreover, as indicated above, different coatings are required depending on the appearance and properties required in the product. It would be desirable to have a coated solar control glass which could be used to provide glazings with a range of reflection colours.

British patent specification 1,152,691 describes the use of heat reflecting metal or metal oxide coatings to protect body coloured heat absorbing glasses from overheating, with the consequent risk of fracture, due to solar heating. To protect the heat absorbing glass, the coating is disposed between the glass and the sun. In one example, a pane of heat absorbing grey glass is used as the inner pane of a double glazing unit, with a gold coating on the surface of the pane facing the airspace of the unit. The outer pane may be of clear float or of 'slightly coloured' glass.

British patent specification 2,174,412A describes a double glazing unit incorporating two coatings. One of the coatings is a low emissivity coating comprising doped tin oxide and/or doped indium oxide, and the other coating is a heat reflecting metal oxide coating comprising at least 30% tin and at least 30% titanium calculated as weight percent of the respective dioxide in the coating. The coatings may be on the same or different panes, and one of the panes may be of body coloured glass. Example 3 describes a double glazing unit having an outer pane of bronze float glass with the heat reflecting metal oxide coating on its outer face (i.e. away from the airspace), and an inner pane with the low emissivity coating on its outer face (i.e. towards the air space).

U.S. Pat. No. 4,069,630 describes a double glazing unit having a low emissivity tin oxide containing coating on the inner face (i.e. towards the airspace) of the outer pane. To mask the iridescent colour of the coating, the outer pane is of coloured heat absorbing glass.

SUMMARY OF THE INVENTION

We have now found that a range of high performance double glazing units of varying colour and performance can be produced, based on glass with a solar control coating of standard composition, and without the need to toughen the coated glass.

According to the present invention there is provided a double glazing unit comprising an outer pane of body coloured heat absorbing glass and an inner pane of annealed glass with a coating including a silver layer having a thickness in the range 15 nm to 40 nm on its face turned towards the outer pane.

The expression "body coloured heat absorbing glass" is used, with reference to the present invention, to refer to glasses which contain heat absorbing metal oxides which colour the glass and which glasses have, when in the form of a pane 6 mm thick, a solar heat absorption of at least 40%. Examples of such glasses are ANTISUN Bronze glass, ANTISUN Green glass and ANTISUN Grey glass (ANTISUN is a trade mark of Pilkington plc; ANTISUN glasses are available from Pilkington Glass Limited).

Preferably the outer pane is of 6 mm thick body coloured heat absorbing glass having a solar heat absorption in the range 45% to 55%.

For most applications, the outer pane will be toughened or partly toughened (for example, "heat strengthened" glass as defined in United Federal Specification DD-G-1403D) to enable it to withstand the temperatures reached in service without fracturing.

The coated inner pane may be a pane of coated clear float glass having a light transmission higher than its total solar hear transmission.

The thickness of the silver layer in the coating on the inner pane is preferably in the range 20 nm to 30 nm. The coating on the inner pane preferably comprises a silver layer sandwiched between two metal oxide layers. The metal oxide layers may be of, for example, tin oxide, indium tin oxide, titanium oxide or zinc oxide, and will usually have a thickness in the range 10 nm to 80 nm especially 20 nm to 60 nm. They may serve as anti-reflection and/or colour modifying layers; the inner layer may also serve as a primer layer and the outer layer as a protective layer.

BRIEF DESCRIPTION OF THE DRAWING

A double glazing unit according to the invention is illustrated, in cross section, in the accompanying drawing. A double glazing unit 1 comprises an outer pane 2 of body coloured heat absorbing glass, an inner pane 3 of annealed glass with a coating 4 including a silver layer having a thickness in the range 15 nm to 40 nm on its face turned towards the outer pane. The panes are held in opposed spaced relationship by a spacing and sealing system 6.

DESCRIPTION OF SOME PREFERRED EMBODIMENTS

The invention is further illustrated, but not limited, by the following Examples. Throughout the specification and claims, including the Examples, the following terms have the meanings given below:

"Light transmission" and "Light reflection" mean respectively the light transmission and light reflection with respect to the C.I.E. Illuminant C expressed in percent. The procedures for calculating these from the spectral transmission and reflection of the glass are well known and given in the standard colour text-books, e.g. W. D. Wright—The Measurement of Colour, Hilger & Watts, London 1964.

"Solar heat absorption" means the percentage of solar radiation absorbed, where the solar radiation spectral distribution is that defined by P. Moon for air mass 2 (Journal of the Franklin Institute, 1940, volume 230, page 583).

"Solar heat reflection" means the percentage of solar radiation reflected, where the solar radiation spectral distribution is that defined by P. Moon for air mass 2 (Journal of the Franklin Institute, 1940, volume 230, page 583.)

"Direct solar heat transmission" means the percentage of solar radiation directly transmitted, where the spectral energy distribution of the solar radiation is taken as that defined by P. Moon for air mass 2. (Journal of the Franklin Institute, 1940, volume 230, page 583).

"Total solar heat transmission" is equal to the direct solar heat transmission plus the percentage of solar radiation which is absorbed and then re-radiated/convected to the inside.

EXAMPLE 1

A double glazing unit as shown in the drawings has an outer pane 2 of thermally toughened ANTISUN bronze glass, 6 mm thick. ANTISUN bronze glass is a bronze body coloured glass available from Pilkington Glass Limited having, when in the form of a pane 6 mm thick, a solar heat absorption of 49%. The inner pane 3 is a 6 mm pane of clear float glass with a coating 4 comprising a layer of silver 23 nm thick sandwiched between anti-reflection tin oxide layers each 60 nm thick to give a coating with a substantially neutral reflection colour. The coating was deposited by a magnetically enhanced sputtering process, using a thin layer of aluminium over the silver, as described in British Patent 2,129,831. The coated pane had a light transmission of 49%, a solar heat absorption of 10%, a solar heat reflection of 60% and a direct solar heat transmission of 30%, all measured with the coating towards the incident radiation. It is the suprisingly high solar heat reflection and very low solar heat absorption of the silver coatings used in the present invention which enables the products of the invention to be used without toughening of the inner pane.

From the outside, the double glazing unit appears bronze in reflected light and bronze in transmitted light. From the inside, the double glazing unit appears silver in reflected light and bronze in transmitted light. The unit has the following optical properties (referring to solar radiation incident on the outer pane):

Light transmission: 25%
Light reflection: 15%
Direct solar heat transmission: 14%
Total solar heat transmission: 24%

EXAMPLE 2

A double glazing unit is constructed as described in Example 1 using a 6 mm pane of thermally toughened ANTISUN Grey glass (available from Pilkington Glass Limited) for the outer pane 2 in place of the ANTISUN Bronze glass used in Example 1.

From the outside, the unit appears grey in reflected light and grey/bronze in transmitted light. From the inside, the double glazing unit appears silver in reflected light and grey/bronze in transmitted light. The unit has the following optical properties (referring to solar radiation incident on the outer pane.)

Light transmission: 21%
Light reflection: 12%
Direct solar heat transmission: 13%
Total solar heat transmission: 23%

EXAMPLE 3

A double glazing unit is constructed as described in Example 1 using a 6 mm pane of thermally toughened "ANTISUN Green" glass (available from Pilkington Glass Limited) for the outer pane 2 in place of the ANTISUN Bronze glass used in Example 1.

From the outside the unit appears green in reflected light and yellow/green in transmitted light. From the inside the unit appears silver in reflected light and yellow/green in transmitted light. The unit has the following optical properties (referring to solar radiation incident on the outer pane):

Light transmission: 36%
Light reflection: 28%
Direct solar heat transmission: 14%
Total solar heat transmission: 24%

EXAMPLE 4

A double glazing unit is constructed as described in Example 1 using a 6 mm pane of thermally toughened ANTISUN Blue glass (available from Pilkington Glass Limited) for the outer pane 2 in place of the ANTISUN Bronze glass used in Example 1.

From the outside, the unit appears blue in reflected light and blue/green in transmitted light. From the inside, the unit appears silver in reflected light and blue/green in transmitted light. The unit has the following optical properties (referring to solar radiation incident on the outer pane):

Light transmission: 27%
Light reflection: 17%
Direct solar heat transmission: 14%
Total solar heat transmission: 24%

Thus it will be seen that the invention provides, using a single coating, a range of high performance solar control double glazing units of different colours. Moreover, because the outer pane is of body coloured heat absorbing glass, and the coating has a very high solar heat reflection and a low emissivity, the coated glass does not become hot in service and it is unnecessary to toughen it.

The silver layer on the glass has a low electrical resistance and, if desired, may be used either for electromagnetic screening as described in U.S. Ser. No. 07/151,988 filed Feb. 3, 1988) or as a heating film. When used for electromagnetic screening, the coating may be provided with a continuous electroconductive bus bar at or adjacent the periphery thereof in electrical contact with the silver layer for connection to earth. If the coating is to be used for heating, it will usually be provided with a pair of separate bus bars each adjacent an opposite edge of the coating in electrical contact with the silver layer for connection to a source of electricity.

However, it is not envisaged that the coatings will usually be used for heating and they will generally be free from a pair of bus bars as described above.

I claim:

1. A double glazing unit comprising an at least partially toughened non-coated outer pane of body coloured heat absorbing glass being a glass which contains at least one heat absorbing metal oxide which colours the glass and which has, when in the form of a pane 6 mm thick, a heat absorption of at least 40%, and an inner pane of annealed glass with a coating including a silver layer having a thickness in the range 15 nm to 40 nm on its face turned towards the outer pane.

2. A double glazing unit according to claim 1 comprising an outer pane of 6 mm thick body coloured heat absorbing glass having a solar heat absorption in the range 45% to 55%.

3. A double glazing unit according to claim 1 wherein the inner pane of annealed glass is of clear float glass and has a light transmission higher than its total solar heat transmission.

4. A double glazing unit according to claim 1 wherein the thickness of silver layer in the coating on the inner pane in the range 20 nm to 30 nm.

5. A double glazing unit according to claim 1 wherein the coating on the inner pane comprises a silver layer sandwiched between two metal oxide layers.

6. A double glazing unit comprising an at least partially toughened non-coated outer pane of body coloured heat absorbing glass, being a glass which contains at least one heat absorbing metal oxide which colours the glass and which has, when in the form of a pane 6 mm thick, a heat absorption of at least 40%, and an inner pane of annealed clear float glass with a coating including a silver layer having a thickness in the range 15 nm to 40 nm on its face turned towards the outer pane, the inner pane having a light transmission higher than its total solar heat transmission.

7. A double glazing unit according to claim 6 comprising an outer pane of 6 mm thick body coloured heat absorbing glass having a solar heat absorption in the range 45% to 55%.

8. A double glazing unit according to claim 6 wherein the thickness of silver layer in the coating on the inner pane in the range 20 nm to 30 nm.

9. A double glazing unit according to claim 6 wherein the coating on the inner pane comprises a silver layer sandwiched between two metal oxide layers.

10. A double glazing unit comprising an at least partially toughened non-coated outer pane of body coloured heated absorbing glass, being a glass which contains at least one heat absorbing metal oxide which colours the glass and which has, when in the form of a pane 6 mm thick, a heat absorption of at least 40%, and an inner pane of annealed clear float glass with a coating including a silver layer having a thickness in the range 20 nm to 30 nm on its face turned towards the outer pane.

11. A double glazing unit according to claim 10 comprising an outer pane of 6 mm thick body coloured heat absorbing glass having a solar heat absorption in the range 45% to 55%.

12. A double glazing unit according to claim 10 wherein the coating on the inner pane comprises a silver layer sandwiched between two metal oxide layers.

* * * * *